United States Patent [19]
Klein

[11] Patent Number: 5,930,889
[45] Date of Patent: Aug. 3, 1999

[54] METHOD FOR MOUNTING PACKAGED INTEGRATED CIRCUIT DEVICES TO PRINTED CIRCUIT BOARDS

[75] Inventor: Dean A. Klein, Eagle, Id.

[73] Assignee: Micron Electronics, Inc., Nampa, Id.

[21] Appl. No.: 08/871,209

[22] Filed: Jun. 9, 1997

Related U.S. Application Data

[62] Division of application No. 08/743,186, Nov. 5, 1996, Pat. No. 5,796,590.

[51] Int. Cl.$^6$ ........................................................ H05K 3/34
[52] U.S. Cl. ........................ 29/840; 228/179; 228/180.21; 228/180.22
[58] Field of Search ............................... 29/840; 228/179, 228/180.21, 180.22

[56] References Cited

U.S. PATENT DOCUMENTS

| | | | |
|---|---|---|---|
| 3,932,934 | 1/1976 | Lynch et al. | 29/843 |
| 5,051,339 | 9/1991 | Freidrich et al. . | |
| 5,056,216 | 10/1991 | Madou et al. | 29/843 |
| 5,155,905 | 10/1992 | Miller, Jr. | 29/843 |
| 5,203,075 | 4/1993 | Angulas et al. | 29/840 X |
| 5,403,671 | 4/1995 | Holzmann . | |
| 5,435,482 | 7/1995 | Variot et al. . | |
| 5,435,732 | 7/1995 | Angulas et al. | 29/840 X |
| 5,442,852 | 8/1995 | Danner . | |
| 5,453,581 | 9/1995 | Liebman et al. . | |
| 5,463,191 | 10/1995 | Bell et al. . | |
| 5,477,933 | 12/1995 | Nguyen . | |

OTHER PUBLICATIONS

C–4/CBGA Comparison with other MLC Single Chip Package Alternatives Puttlitz, K., et al., *IEEE Transactions on Components*, Packaging and Manufacturing Technology Part B, 18(2):250–256, 1995.

Statistical model for the inherent tilt of flip chips Goldmann, L., *Journal of Electronic Packaging*, 118:16–20, 1996.

Determination of Optimal Solder Volume for Precision Self–Alignment of BGA Using Flip–Chip Bonding Nasiatka, P., et al., *IEEE Hong Kong Electron Devices Meeting*, 1995.

*Primary Examiner*—Carl J. Arbes
*Attorney, Agent, or Firm*—Knobbe, Martens, Olson & Bear, LLP

[57] ABSTRACT

An apparatus and method for surface-mounting ball grid array integrated circuit (IC) devices to printed circuit boards. A thin single- or multi-layer sheet of nonconductive material having a plurality of apertures corresponding to the leads of the IC device to be mounted is interposed between the ball grid array and the circuit board prior to solder processing to facilitate solder application, device alignment, and solder retention. An assembly guide is located on the top surface of the aid to assist in the orientation and placement of the IC device during assembly. In a further aspect, the disclosed assembly aid helps compensate for non-planarity in the IC device array or circuit board, and maintains a minimum standoff distance between the IC package and the circuit board to preclude undue solder joint deformation. The assembly aid also allows for reworking of the surface mount by facilitating localized placement of the solder prior to reflow processing without masking or other additional processing steps.

7 Claims, 9 Drawing Sheets

METHOD FOR MOUNTING PACKAGED INTEGRATED CIRCUIT DEVICES TO PRINTED CIRCUIT BOARDS

RELATED APPLICATIONS

This application is a divisional of U.S. patent application Ser. No. 08/743,186, filed Nov. 5, 1996, now U.S. Pat. No. 5,796,590.

BACKGROUND OF THE INVENTION

1. Field of the Invention

The present invention is related to the field of integrated circuits and surface mount technology. More specifically, the present invention is directed to an assembly aid for facilitating the surface-mounting of ball grid array (BGA) integrated circuit (IC) devices to printed circuit boards (PCBs), chip carriers, or similar components using reflow solder methods.

2. Description of Related Technology

Surface mount technology (SMT) is increasingly being employed as a cost-effective means of mounting IC devices to printed circuit boards. Numerous different techniques for mounting integrated circuit devices to circuit boards, chip carriers, or other components fall within the general category of SMT. Of these techniques, area array (as opposed to perimeter array) technology is often used to mount high I/O density packages with a great degree of reliability and manufacturing efficiency. Area array techniques include the use of pin grid arrays (PGAs), column grid arrays (CGAs), and ball grid arrays (BGAs). The more recent BGA and CGA techniques provide substantial improvements over PGA methods in that higher densities, reliability, and efficiency can be obtained for many types of packages.

As the name implies, ball grid arrays (BGAs) utilize a grid or array of electrical terminals, such as solder bumps or balls arranged on one side of the IC package to effectuate electrical contact with the circuit board. The solder bumps of the array may vary in material, size (height and width) and pitch (i.e., bump-to-bump spacing) based on the individual package. Standard bump heights may range from less than one to several millimeters. Standard pitches in common use are 1.00, 1.27, and 1.50 mm (PBGA and CBGA) and 0.5 mm (MBGA). Additionally, the solder bumps may be arranged in a uniform or non-uniform array pattern, with some leads removed in certain areas, which is referred to as "depopulation," depending on the desired attributes of the package. Solder bumps or balls are typically attached to the board or module using a eutectic solder with a lower melting point than that of the solder balls of the array, thereby allowing removal and rework without damage to the components.

The preferred substrate attachment site or land pattern geometry for use in BGA packages is usually circular or rectangular with the dimensions adjusted to meet ball size and pitch requirements. The lands or pads may also be recessed into the circuit board. A large number of different attachment schemes and pad geometries have been devised for use in such applications, the properties of which are well understood in the surface mount field.

Common BGA package configurations include ceramic (CBGA) and plastic (PBGA), as well as micro-BGA (MBGA). Each of these types of packages has its own attributes, which are also well understood in the field of SMT. Package outline specifications are presented in industry standards such as the joint industry council JEDEC Publication 1995. In addition to individual IC devices, multi-chip modules or chip carriers can also be effectively surface mounted using area array techniques.

Figure 1:
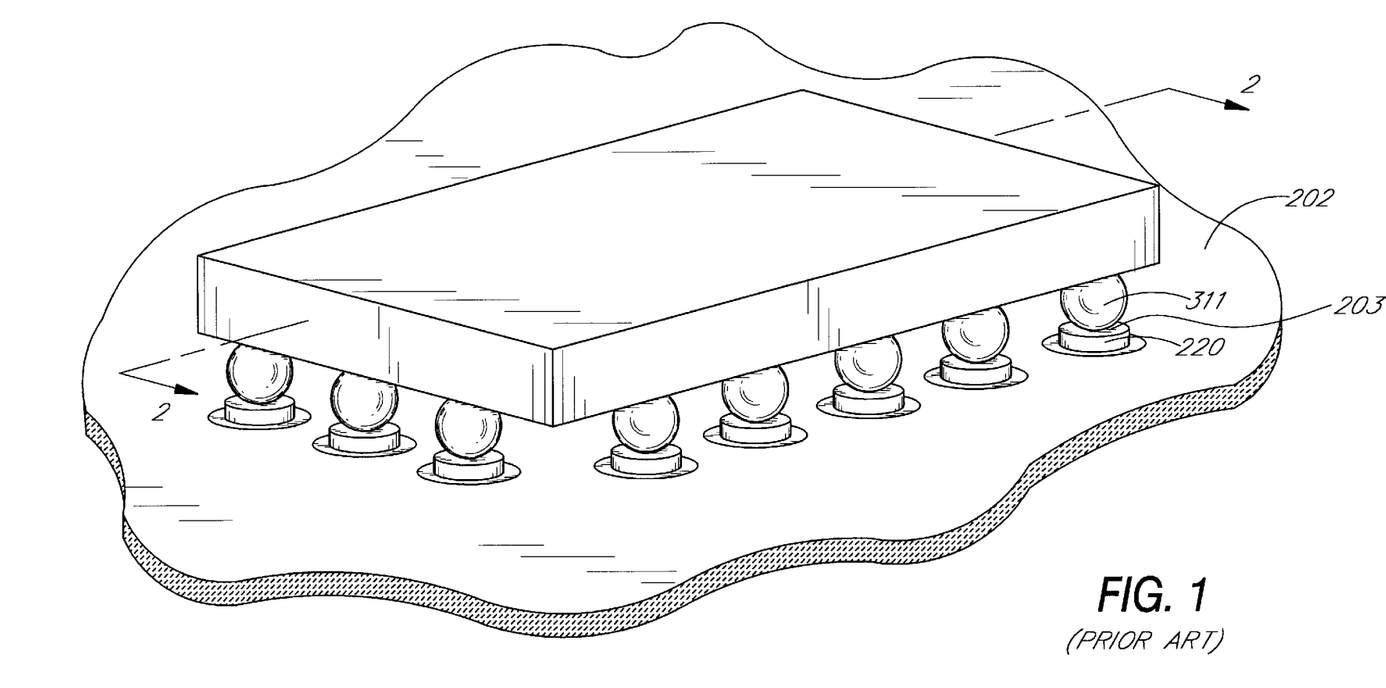
FIG. 1 is a perspective view of a prior art printed circuit board assembly having a ball grid array integrated circuit device and masked substrate.

FIG. 1 depicts a typical prior art surface mount of a BGA IC device 200 on a printed circuit board 202, showing the solder joints 203 formed between the terminals 311 of the BGA and the PCB lands 220.

BGA packages are typically mounted to the desired substrate or component using reflow solder processing techniques. Reflow soldering processes generally use forced convection heating (air or nitrogen) to melt and reflow solder beads or paste interposed between the surfaces to be joined. A paste, ball or other form of solder such as Pb/Sn, Pb/Sn/Ag or similar composition, depending on the desired attributes, is set between the BGA ball leads and the etched land or pad of the PCB or chip carrier and exposed to a temperature profile which results in reflow of the solder. Surface tension created in the resulting solder liquid mass during reflow tends to prevent collapse of the solder, causing the joint to eventually solidify in a barrel or truncated sphere shape that is commonly referred to as a Controlled Collapse Chip Connection, or "C-4". Numerous variations on this general theme exist, including the use of two or more different solders with various melting points to produce reflow of various portions of the joint during different processes, or to allow rework.

In one type of reflow process, pre-tinned leads of an IC device are attached to a substrate etched to receive these leads. A solder paste stencil having apertures that are the same or nearly the same size as the etched pads (lands) on the PCB is aligned on the substrate; solder paste is applied to the unmasked areas, and the stencil is subsequently removed. The IC device is then placed such that the leads contact the paste on the etched pads, and the entire assembly is passed through a reflow processing oven which applies a predetermined time temperature profile to the solder paste and tinning to liquify these substances and form a solder joint between the lead and the substrate pad.

Figure 2:
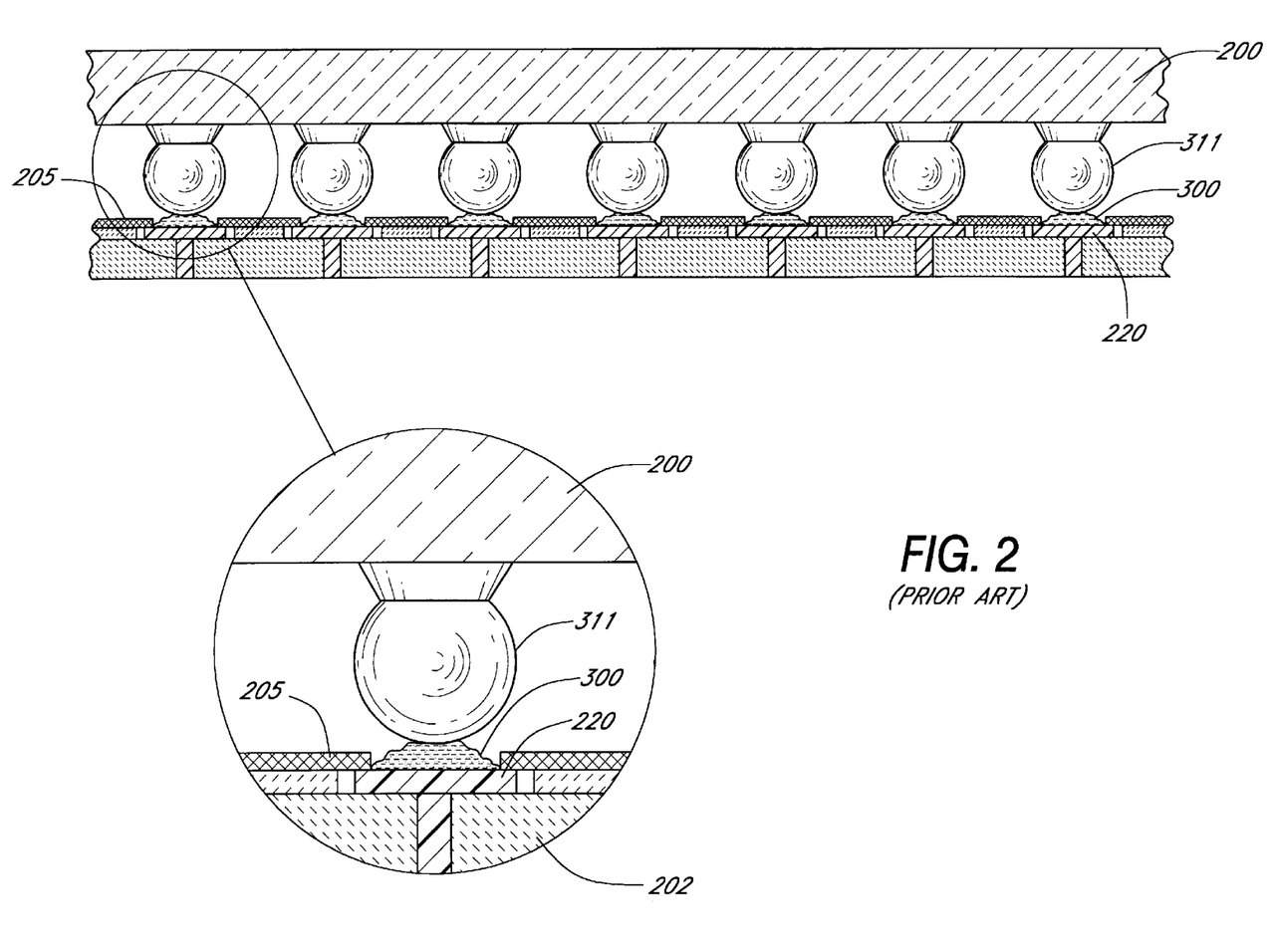
FIG. 2 is a cross-sectional illustration of the prior art printed circuit board assembly, taken along line 2—2 of FIG. 1.

Land areas may be determined by solder masking, etching, or other methods. In the commonly used technique of solder masking depicted in FIG. 2, the paste 300 may be applied through a solder mask 205 which is later removed so that the solder matches the shape and size of the pad 220 ("mask free"), or with somewhat more restricted dimensions so that the paste 300 does not cover the entire area of the pad ("mask defined"). Mask-free patterns tend to promote a uniform tapered column profile, while the mask-defined areas tend to promote controlled collapse (C-4) profiles during reflow. As shown in FIG. 2, the deposition of solder paste on the circuit board land pad 220 is not always uniform or conducive to proper alignment of the ball terminal with respect to the land.

In addition to the reflow method described above, IC devices may also be surface mounted using deposition of solid solder elements. In this process, the solidified solder elements are placed in position on the substrate pads, with the small amount of solder flux resident on the element used to adhere the element to the substrate. The IC device is then placed with its terminals in contact with the solder elements, and the assembly is exposed to an appropriate reflow time-temperature profile to form the solder joints. This method has the advantage of obviating the masking and solder paste application process described above; however, it requires the precise placement of the solid solder elements in relation to the pads and, ultimately, the IC device leads.

Various methods of applying and forming solder paste or solidified elements on the substrate have been devised. For example, U.S. Pat. No. 5,403,671 discloses a method of forming desirable solder shapes on individual contact pads of the PCB using a permanent mask and wire mesh compressed onto the solder during heating. This approach has the drawbacks of requiring the use and placement of the mask and wire mesh, as well as requiring extra processing steps related to the heating and compression of the assembly.

U.S. Pat. No. 5,051,339 discloses a method by which a PCB is masked and laminated with a temporary photoimageable layer prior to immersion in a pool of molten solder. A closure element is used following the immersion to flatten the solder into the pad areas during cooling, thereby forming solder "pillars" in the unmasked pad regions. This technique suffers from several drawbacks, including the difficulty of stripping the temporary layer from the substrate after pillar formation, and the physical instability of the pillars during component mating. Additionally, the technique does not lend itself to component rework, particularly when other components (i.e., other than the component being reworked) may already be mounted to the circuit board.

U.S. Pat. No. 5,442,852 discloses a method of fabricating a high density array of solder balls by perforating a thin sheet of dielectric material to create a aperture grid or array. The dielectric sheet is than mated to the substrate, with the lands or pads coinciding with the apertures. Spherical solder balls are placed in each of the apertures, and the assembly is then heated such that the balls reflow into the apertures and bond to the pads on the substrate. A substantially spherical portion of the ball remains above the aperture due to the effects of surface tension. The resulting ball/substrate array can then be used to mate the substrate to another substrate. This invention does not provide for facilitating the mounting of an IC device have a preexisting terminal array to a substrate, but rather is designed for forming of the terminal (ball grid) array itself. Additionally, no means of alignment of the sheet with relation to the PCB or IC device is provided.

IC devices and PCBs may have some degree of nonplanarity or "warpage" as a result of the manufacturing process and/or storage prior to surface mounting. CBGA packages are generally less susceptible to warping of the package itself as compared to PBGA packages; however, PBGA packages offer inherent advantages in terms of manufacturing cost, making their use desirable in many applications. Additionally, the printed circuit board and/or IC device may undergo some degree of warpage due to mechanical stresses resulting from thermal expansion during heatup, cooldown, or normal operation. As the components warp, varying degrees of stress may be placed on the solder joints of the BGA. In extreme cases, such stresses may result in the failure of one or more solder joints, or more typically, failure to form one or more joints during reflow processing.

One method of compensating for such warpage is disclosed in U.S. Pat. No. 5,435,482 which teaches planarizing the ball grid terminal array associated with BGA devices such as PBGAS, which are susceptible to warpage during manufacture and processing. This patent discloses the use of a number of solder balls of different shapes and diameters which are then planarized by pressing the substrate to which the balls are attached to a platen, which may be heated to deform the solder balls as necessary to make uniform contact with the plate. This process in effect provides a more planar BGA package, and is completed prior to positioning and reflow processing. However, the process requires specialized equipment, such as a vacuum chuck for holding the packages, specialized processes for the manufacture and use of non-uniform solder balls, and at least one extra processing step prior to reflow.

During the reflow soldering process, the alignment of the IC device is critical to the acceptability and longevity of the solder joints between the components to be joined. Furthermore, if excessive normal force is applied, the quality of the resulting reflow solder joints may be affected, producing a condition referred to as "squashing". As previously discussed, surface tension of the liquid solder produces a resilient force and helps maintain the integrity of the joint. If the normal force is excessive, one or more joints may collapse thereby resulting in unwanted wetting of adjacent features, solder shorts, balls, or other undesirable side-effects. See "A Model for Deformation of Solder Bumps From Ramp Loading" by L. Goldmann, Journal of Electronic Packaging, March 1996. incorporated herein by reference. Similarly, if the device is pitched at an angle to the board during reflow processing, the joints on a portion of the array may collapse, whereas those on other portions of the array may not form.

BGA devices used in surface mount applications can be somewhat self centering; see for example "Determination of Optimal Solder Volume for Precision Self-Alignment of BGA Using Flip Chip Bonding" by P. Nasiatka and Z. Karim, Proceedings of the 1995 IEEE Hong Kong Electron Devices Meeting. This property results from a number of factors including the surface tension generated during reflow, and lateral forces generated by the array leads or balls fitting into the terminal pads, which often have a somewhat concave or hemispherical shape to receive the leads. However, due to other factors such as misalignment during placement, equipment vibration, variations in solder ball volume and dimensions, thermal gradients, and human error, the device being mounted is often not in the desired alignment when reflow processing is begun, and such self-centering forces are insufficient to cause realignment. Furthermore, some processes such as solder masking may produce solder paste shape which are amenable to easy positioning prior to reflow, thereby potentially reducing surface tension restoring forces.

Based on the comparatively small pitches in use with presently existing BGA/MBGA packages, slight misalignment of the device during reflow processing can result in joint defects including voids, solder shorts, or even failure to form a joint. Such defects can produce high electrical resistance or shorts, as well as reduced component or joint longevity, thereby ultimately requiring rework of the component. Proper alignment during reflow processing is therefore critical to high manufacturing efficiency.

Rework processing is another consideration when using BGA devices in SMT applications. If the numerous joints of the BGA package do not form properly during the initial reflow process, the package must be removed and remounted to the PCB. When other devices are already mounted to the board, remasking, pasting, and resoldering using existing SMT methodologies is often impractical or unfeasible. In some such situations, the BGA package is removed from the board and the board is discarded rather than reworked, thereby contributing to increased manufacturing cost and processing time.

A similar consideration relates to BGA package mounting and reworking during PCB design. During the design phase, the layout of many circuit boards (i.e., the placement of components on the board) is often not well established and subject to frequent change. Relocation of a given BGA package is potentially problematic using existing technology for the reasons described above. Note that BGA packages do not lend themselves to the use of sockets and receptacles, thereby making surface mounting of the package a virtual necessity. Hence, "prototyping" of circuit boards using BGA packages would be substantially simplified if the package(s) could be readily removed and remounted without the need to rework the entire board.

Based on the foregoing, it would be most desirable to provide an improved apparatus and method for mounting one or more integrated circuit devices on a printed circuit board or other component which would overcome the limitations of existing surface mount and reflow soldering technology by improving the efficiency and reliability with which such assemblies could be manufactured while also facilitating rework and prototyping. Such an improved method would i) provide for more rapid and accurate orientation and placement of the IC device with respect to the substrate prior to reflow soldering; ii) reduce the number and/or complexity of prosing steps necessary to prepare the assembly for reflow processing; iii) facilitate maintaining proper relative alignment of the package and substrate during actual reflow processing to enhance joint formation; and iv) permit easy rework of one or more IC devices mounted in proximity to other devices.

SUMMARY OF THE INVENTION

The present invention satisfies the aforementioned needs by providing an improved apparatus for surface mounting BGA. IC packages to printed circuit boards. A cost effective and simplified method for mounting the BGA device to the PCB is also disclosed.

In a first aspect of the invention, an assembly aid for surface mounting ball grid array packaged integrated circuit devices to printed circuit boards or other similar components is provided. The assembly aid is composed of one or more thin, electrically nonconductive and partially compressive sheets which include apertures extending through their thickness and corresponding to the ball lead terminals of the ball grid array, as well as having a visual assembly guide on its top surface. The aid provides a means for retaining and aligning solder paste or individual solidified solder elements with respect to the terminals of a ball grid array and the substrate such that the IC device may be more rapidly and accurately oriented and positioned, and electrical contact between the terminals of the array and the circuit board may be established via reflow soldering. One embodiment of the assembly aid also helps compensate for minor warpage or non-planarity of the package and/or circuit board in the region of the surface mount by allowing for joints of varying dimensions between the individual array solder balls and their respective PCB land areas. This is made possible by the somewhat viscous state of the unprocessed solder paste and/or the flexibility/compressibility of the assembly aid sheet material. The assembly aid also helps to mitigate "squashing" or loading of the IC device during soldering by maintaining a minimum standoff distance between each individual substrate land and its corresponding BGA lead.

In a second aspect of the invention, an improved method of mounting BGA IC devices to a printed circuit board using the aforementioned assembly aid is disclosed. The assembly aid is placed on or bonded to the printed circuit board in the desired orientation, and the BGA packaged device is subsequently aligned over the assembly aid, at which point the entire assembly (IC device, assembly aid, and PCB) is heated to the appropriate temperature for a prescribed time to initiate reflow of the solder paste or elements positioned in the assembly aid. This method permits more rapid and accurate placement, alignment, and reflow soldering of the BGA device than existing prior art methods, without the need for masking or other similar techniques. Also disclosed are improved computer circuit boards having a BGA packaged IC device mounted using the assembly aid and method described above.

DETAILED DESCRIPTION OF THE PREFERRED EMBODIMENT

Reference is now made to the drawings wherein like numerals refer to like parts throughout.

Figure 3:
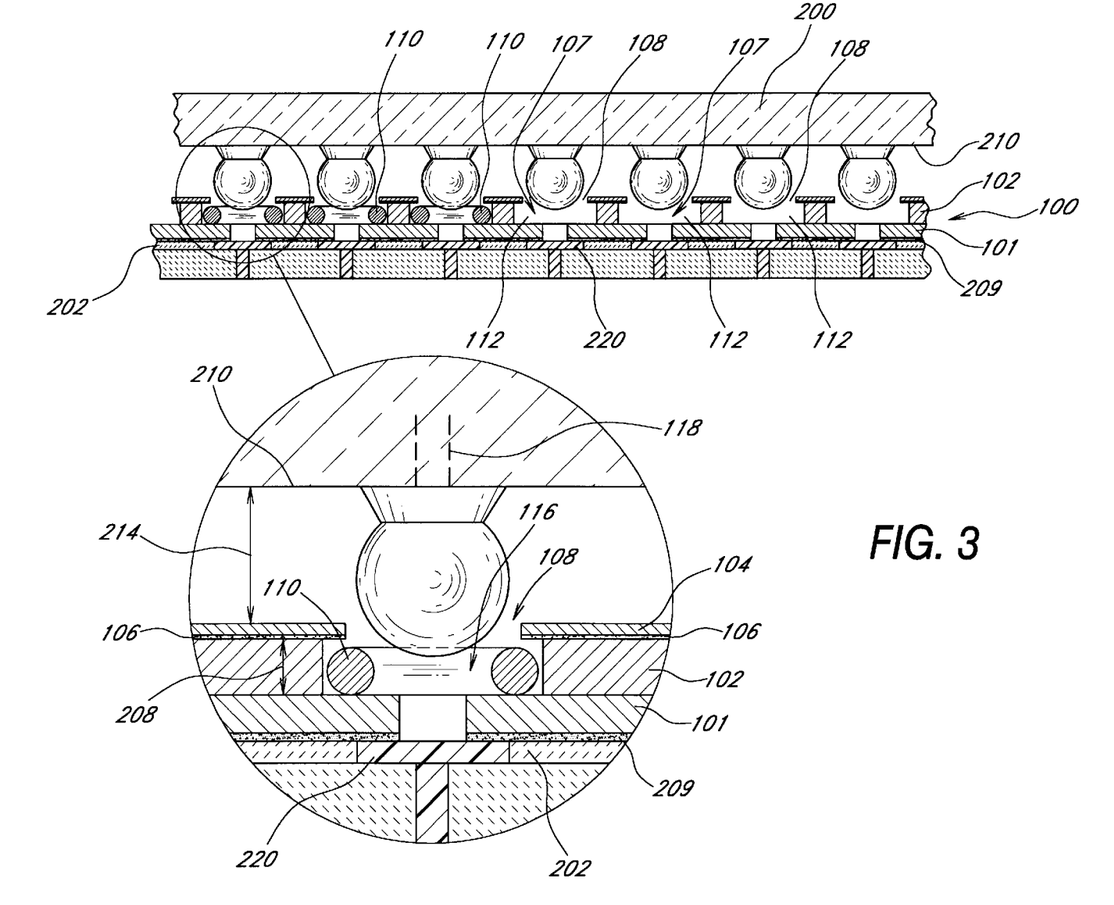
FIG. 3 is cross-sectional illustration of a first preferred embodiment of the ball grid array assembly aid of the present invention, incorporating a plurality of solidified eutectic solder elements.

A first preferred embodiment of the assembly aid is shown in. FIG. 3. The assembly aid 100 is composed of one or more substrate 101, 102 fabricated from a nonconductive and flexible dielectric material such as cardstock, Kapton™ (polyimide), low-density polyethylene, or elastomer of sufficient temperature resistance. In the case of multiple substrates, the individual layers 101, 102 are bonded together to form a single assembly. A plurality of apertures 107 are cut or formed in the second substrate layer 102 to receive solder. A layer of material 104 of similar composition to that of the substrates previously described having an adhesive surface 106, and apertures 108 of somewhat smaller diameter than those of the second substrate 102, is overlayed over the substrate(s) 101, 102 such that the apertures in the layer 104 and substrates 101, 102 are coincident, and a plurality of recesses 112 are formed. During assembly, the layer 104 captures a plurality of solder elements 110 within the recesses 112 formed in the substrate 102 to receive these elements. This layer of material 104 may be of solid form with its apertures stamped or cut out, or alternatively may be an adhesive coating sprayed onto the substrate 102 before or after the solder elements 110 are positioned. Alternatively, rosin flux-coated solder elements 110 may be used such that the adhesive property of the flux (i.e., "tackiness") maintains the position of the elements within their recesses 112 without resorting to use of the adhesive layer 104.

During mounting, the assembly aid 100 of FIG. 3 is interposed between a circuit board 202 and an IC device 200 such that the apertures 108 in the assembly aid align with their respective terminals of a BGA 311, the holes or depressions 116 in the individual solder elements, and the PCB lands 220. The assembly aid 100 is bonded to the circuit board 202 using any number of commercially available adhesives 209 or processes suitable for such applications. The aforementioned solder element recesses 112 in the upper surface of the assembly aid substrate 102 may be of a depth represented by arrows 208 sufficient to preserve a clearance indicated by arrows 214 between the bottom surface 210 of the IC package 220 and the top surface of the adhesive layer 104 of the assembly aid when the package is mounted, thereby facilitating air circulation around the package. Alternatively, the depth represented by arrows 208 may be adjusted so that contact is main ed between the bottom of the IC package 210 and top of the adhesive layer 104 when mounted, thereby facilitating direct conduction of heat into the assembly aid 100 and ultimately into the underlying circuit board.

The preferred shape for the solidified solder elements 110 included in the first embodiment of the assembly aid of FIG. 3 is toroidal ("donut" shaped), and being sized in relation to the aperture through the aid substrate 108 such that the elements 110 will not fall through the apertures during assembly/processing. Other solder element shapes may be used, including square, rectangular, or polygonal blocks. Note also that a hole through each element 116 is not essential, a depression or concavity in the element will also meet the object of maintaining lateral alignment of the BGA during placement and subsequent reflow processing. In the case of solder paste, the paste will maintain sufficient deformability such that the leads of the device will be received by the paste when the device is mated to the assembly aid prior to reflow.

Figure 4:
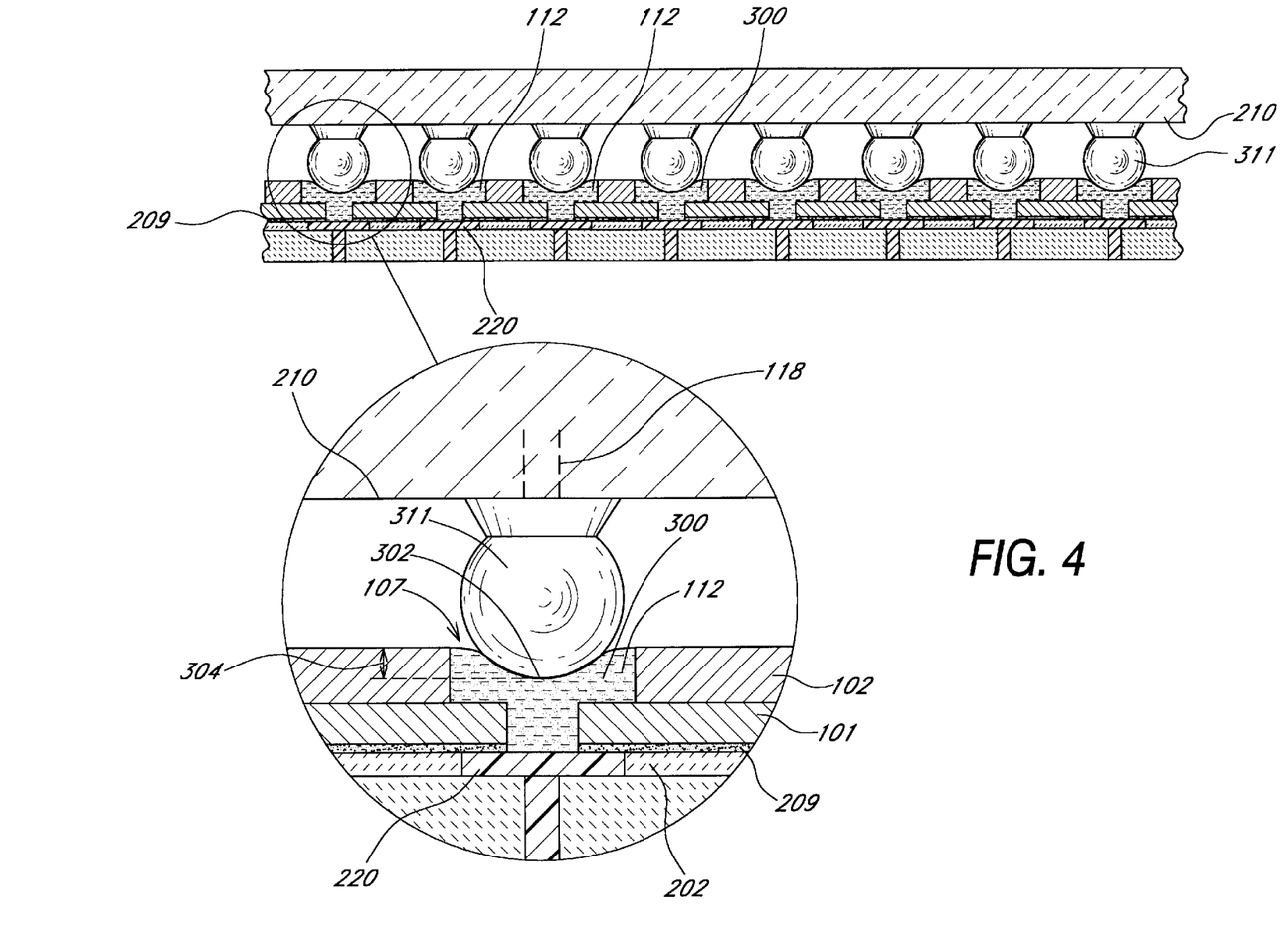
FIG. 4 is a cross-sectional illustration of a second preferred embodiment of the ball grid array assembly aid of the present invention, incorporating a eutectic solder paste.

FIG. 4 shows a second embodiment of the present invention, in which the apertures 107 in the assembly aid substrate 102 are filled with a eutectic solder paste compound 300 prior to reflow soldering, the composition and properties of which are well understood in the art. The use of solder paste obviates the need for the aforementioned solid solder elements and adhesive retaining layer. The solder paste may be made concave as illustrated at 302 or otherwise deformed during IC device placement so as to receive the ball terminals 311 on the bottom side of the BGA package 210 when assembled. Additionally, the use of solder paste 300 helps compensate for minor non-planarity of the IC package and/or PCB 202 in that the individual BGA leads 311 can be received to varying depths such as indicated by arrows 304 within their respective solder paste elements without compression of the assembly aid substrate 102.

The assembly aid is sized and the apertures cut according to the type, size, and lead configuration of the device(s) being mounted. It can be appreciated that a large variety of different array configurations, package designs, ball pitches, and component functions can be accommodated by the features of the present invention. In the preferred embodiments of FIGS. 3 and 4, the apertures 108 are circular in cross section, corresponding to the preferred toroidal solder elements and/or the circular cross-section of the BGA terminals. These apertures 108 traverse the entire thickness of the substrate, although it can be appreciated that other shapes may be used successfully based on IC terminal and PCB land geometries in use. A recess of larger diameter may be cut partway into the top surface of the assembly aid 100 so as to receive the solidified solder elements or paste. The assembly aid 100 may also be formed by bonding two or more layers of substrate material 101, 102 together, the apertures in which are of different diameters so as to receive the solder elements or paste on the upper surface, as depicted in FIGS. 3 and 4. Alternatively, the apertures may be tapered to accomplish the desired function.

The preferred material for the solder elements 110 or solder paste 300 is a metal eutectic with melting point below that of the terminal leads on the BGA, or of any solder joining the solder balls of the grid to the package vias 118. Common eutectic solders suitable for this application include 63% Sn/37% Pb, 62% Sn/36% Pb/2% Ag, and 62% Sn/36% Pb/2% In, all with a melting point of roughly 180 degrees Celsius. It can be appreciated, however, that other solder compositions with different melting points may be used in this application.

Figure 5:
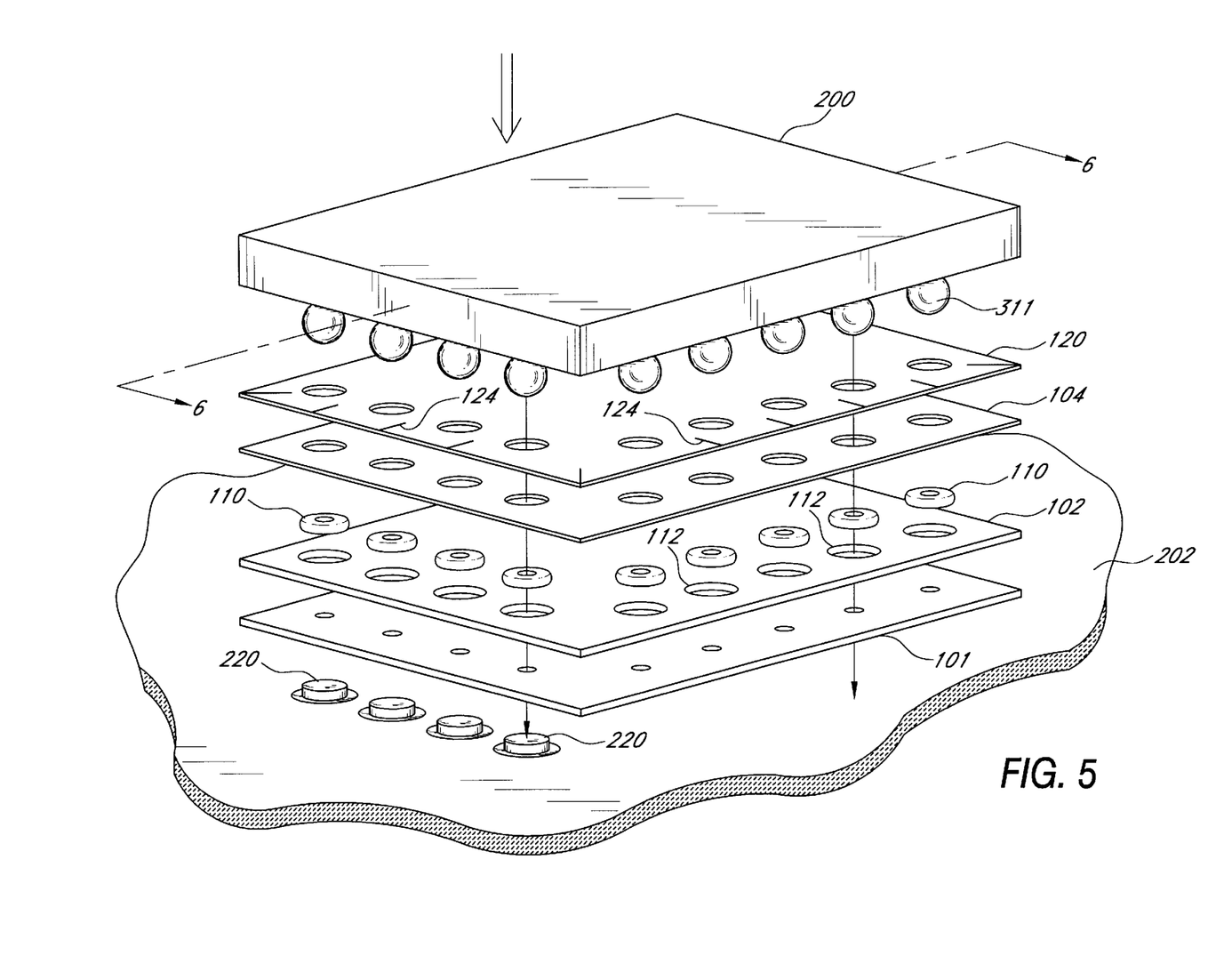
FIG. 5 is an exploded perspective illustration of a first preferred embodiment of the assembly aid, BGA packaged IC device, and printed circuit board.

Referring now to FIG. 5, it is seen that in the preferred embodiments, an alignment or assembly guide 120 is printed or attached to the upper face of the substrate 102 or adhesive layer 104 to facilitate aligning the device. This guide 120 is useful not only in determining the lateral (i.e., x-y) placement of the IC device prior to soldering, but also the orientation of the device, insuring the device is not rotated 90 or 180 degrees from the desired orientation. Furthermore, the guide 120 can be used in aligning the assembly aid with respect to the circuit board 202 prior to or coincident with IC placement. In one embodiment, the guide 120 includes a series of alignment reference marks 124 printed directly on the upper face of the assembly aid 100 using conventional printing techniques. It can be appreciated that a number of different styles, configurations and colors of mark may be used without departing from the spirit of the present invention.

When the BGA IC device 200 is placed on top of the assembly aid 100 as shown in FIGS. 3 and 4, the solder bumps 311 of the grid are readily aligned with the apertures or depressions in the solder elements 110 or paste 300 and those in the substrate 102 such that during processing, the solidified or paste solder elements will reflow within the apertures of the assembly aid substrate and form an electrical contact between the BGA terminals 311 and the land areas on the printed circuit board 220. As was previously noted, this is accomplished by choosing paste or solder elements having a melting point or liquidus temperature lower than that of the solder balls of the array. After exposure to the reflow process, the ball terminals of the BGA 311 are left generally intact such that subsequent reworking of the surface mount may be performed. Note also that if some non-zero clearance is maintained between the bottom of the IC package and the top surface of the assembly aid as previously described, flow of the hot gas around the individual solder elements during reflow processing is not inhibited, thereby mitigating the creation of substantial non-uniformities in temperature across the array terminals.

Figure 6A:
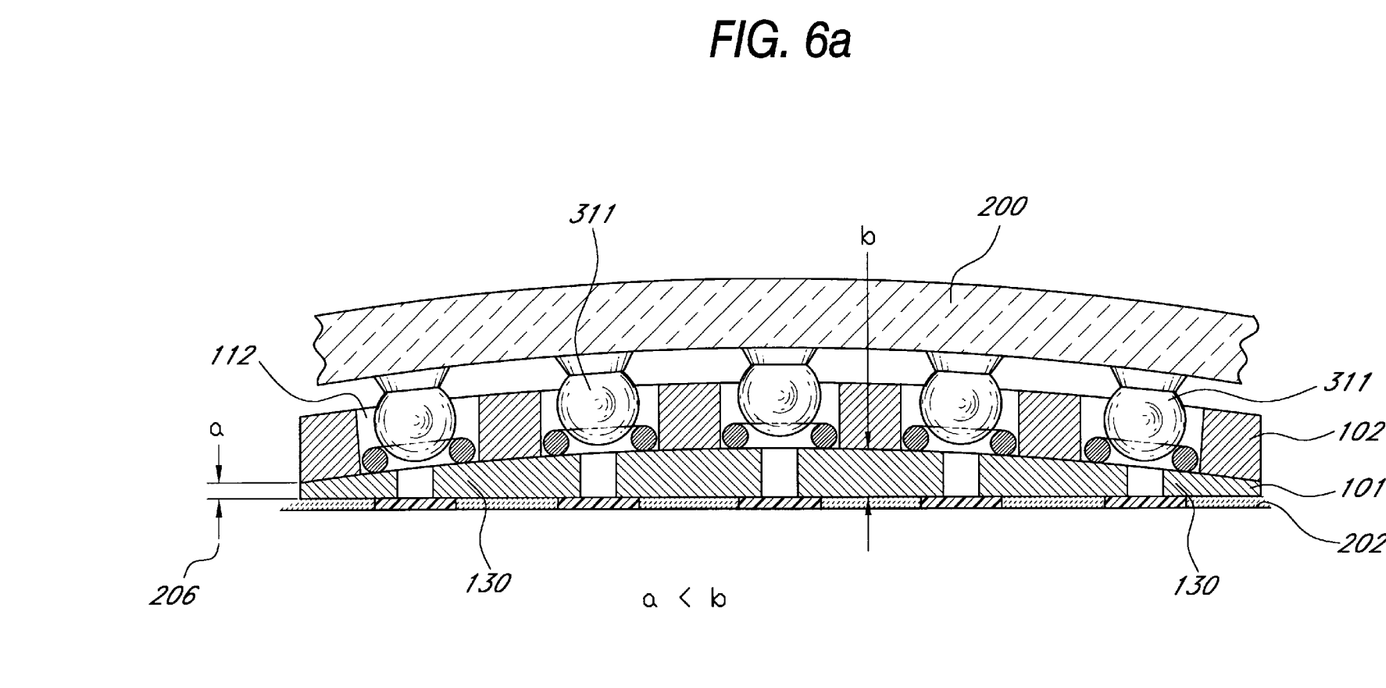
FIG. 6a is a cross-sectional view of the first embodiment of the present invention and a BGA IC device, taken along line 6—6 of FIG. 5 and illustrating IC device non-planarity and compensation therefor by the assembly aid.

The overall thickness of the assembly aid, including the substrates 101, 102 and any adhesive or other layers communicating therewith, is determined by the individual IC package type and terminal design in use, but will typically be on the order of 0.05 in. (1.27 mm) for BGA packages. Compressibility of this material is not essential, but in the case of the first embodiment described above, compressibility aids in compensating for instances of undesired minor non-planarity of the BGA IC device 200 and/or the PCB 202 in that region, as shown in FIG. 6a. In FIG. 6a, the non-planarity of the IC device 200 (exaggerated for clearer illustration) results in penetration of the balls of the array 311 to varying depths in the solder element recesses 112. Hence, compression of the portions of the assembly aid substrate 101, 102 at either end of the IC device including the region immediately supporting the solder elements 130, is necessary to permit contact between the balls of the array 311 and the solder elements 110. A non-resilient (i.e., high compression set) material such as cardstock is preferred to prevent upward forces on the solder joints after compression/reflow processing. If a compressible material is used, a minimum compressed thickness 206 corresponding to the desired minimum height of the solder joints is also desirable.

Figure 6B:
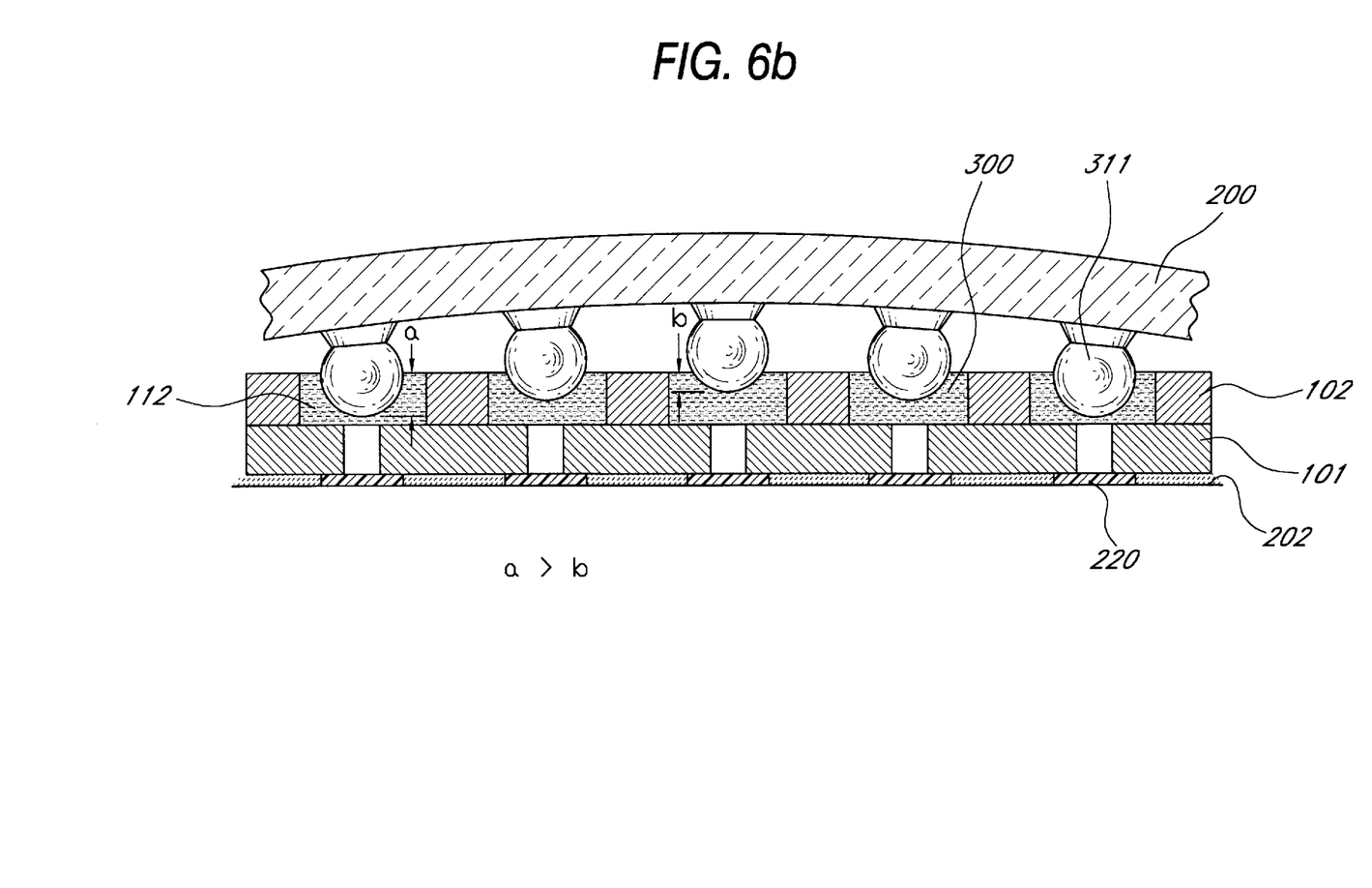
FIG. 6b is a cross-sectional view of a second embodiment of the present invention and a BGA IC device, taken along lines similar to those of FIG. 6a and illustrating IC device non-planarity and compensation therefor by the assembly aid.

FIG. 6b shows the effects of IC device non-planarity on a second preferred embodiment of the assembly aid. As previously described, this embodiment uses a deformable solder paste in place of the solidified solder elements in the recesses 112. This obviates the need for compression of the substrate layers 101, 102 since the individual balls of the array 311 are free to penetrate to varying depths in their respective recesses 112 while still maintaining adequate contact with the solder paste. Hence, some degree of non-planarity of the ball grid array can be accommodated since the solder paste 300 in each recess 112 will deform to the necessary depth required to receive the respective BGA terminal ball 311. As shown in the particular example of FIG. 6b, the BGA balls in the center of the IC device 200 will require less penetration and deformation of the solder paste as compared to those at either end of the IC device.

It is apparent that each of the above identified embodiments have limitations regarding the degree of IC device non-planarity which can be accommodated while still maintaining adequate array ball-to-solder contact. Generally, however, non-planarities present in modern BGA IC packages are low (on the order of 0.001 in. or less) such that they may be compensated for by either embodiment of the present invention. It can be appreciated that other types of non-planarities (such as the inverse of that shown in FIGS. 6a and 6b, or torsional distortion), and minor non-planarities in the circuit board itself may also be compensated for in similar fashion by the present invention.

Figure 7A:
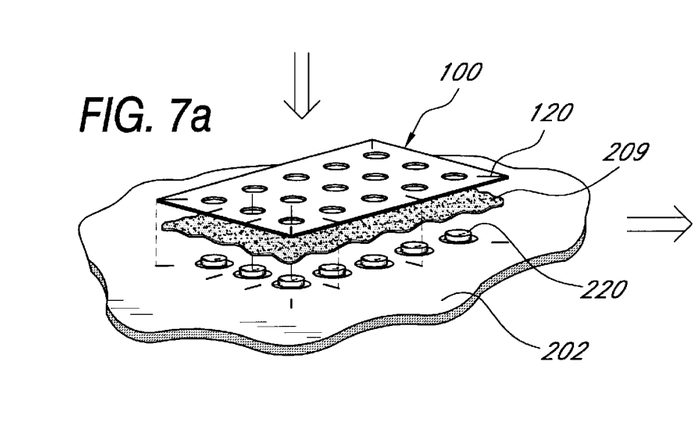
FIGS. 7a through 7d comprise a process diagram illustrating one preferred method of mounting a IC BGA device on a circuit board.
Figure 7B:
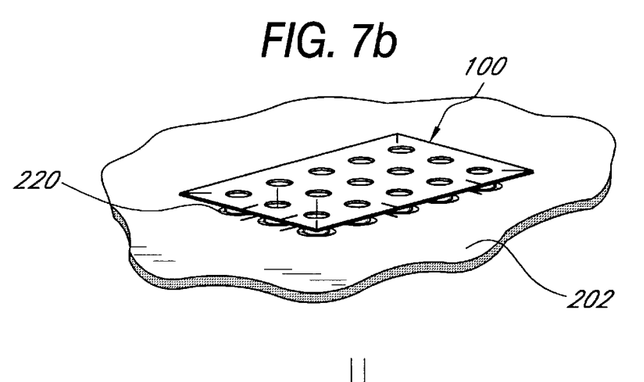
Figure 7C:
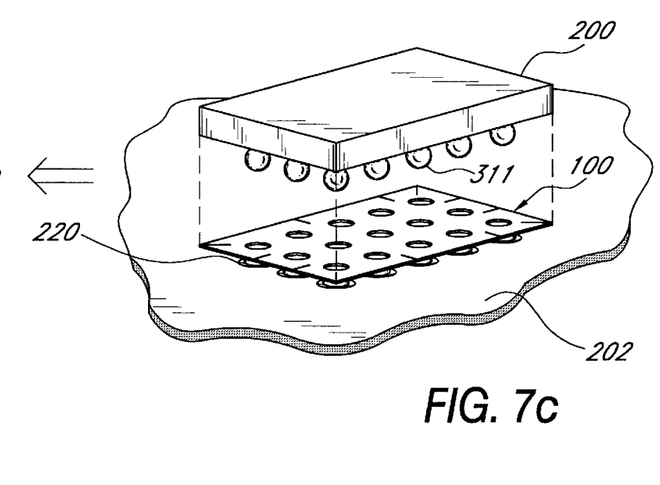
Figure 7D:
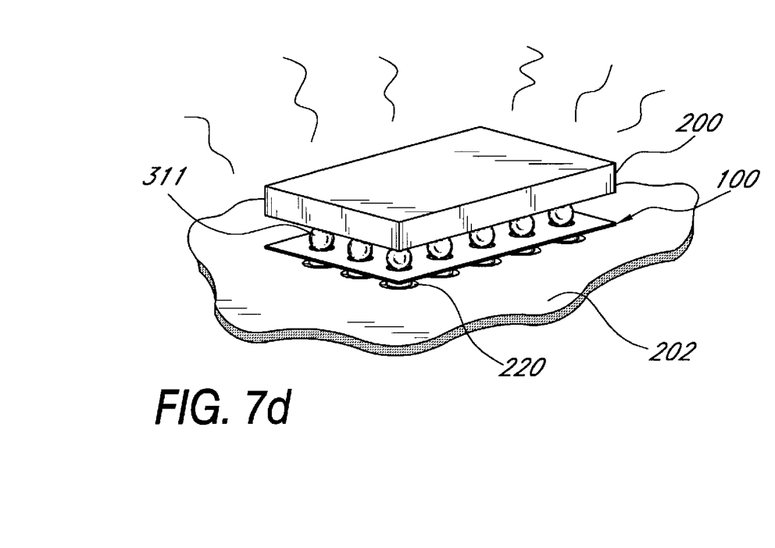

Referring now to FIGS. 7a through 7d, in a first preferred method of mounting a BGA IC device 200 to a circuit board 202, the pre-assembled assembly aid 100, including the solder elements 110 and overlaid adhesive layer 104, or alternatively the solder paste 300, is positioned with respect to the circuit board using the alignment guide 120 previously described, as shown in FIG. 7a. The assembly aid is then bonded to the circuit board 202 using an adhesive 130 or other comparable means as shown in FIG. 7b. The adhesive 130 may be applied to the bottom of the assembly aid 100, or to the circuit board itself. The IC device 200 is then positioned according to the alignment guide 120 atop the assembly aid 100, with the ball grid array solder bumps 311 aligned with the solid or paste solder elements captured in the upper surface of the assembly aid substrate 102 (FIG. 7c). Appropriate normal force is applied to properly seat the device and to compress the substrate if desired, and a predetermined reflow processing heating profile such as that set forth in FIG. 8 and described below is then used to melt the solder elements 110 or paste 300 and form the electrical joints between the ball grid array and PCB lands (FIG. 7d). Conventional reflow processing methods may be utilized, thereby obviating the need for any specialized equipment. The reflow process conditions suitable for use with the present invention will vary as a function of numerous factors including the type of IC package, substrate and adhesive layer material chosen, type and composition of solder, and type of circuit board to which the IC is being mounted.

In a second method, the assembly aid is bonded to the PCB, and the solder paste or elements is/are applied to the assembly aid afterwards. Alternatively, in a third method, the solder paste or solid elements are placed in the apertures of the assembly aid which is then mated to the IC device prior to being bonded to the PCB as a unit and subsequently reflow soldered. It is apparent that various permutations of the basic process described above may be used depending on the attributes desired by the user.

Figure 8:
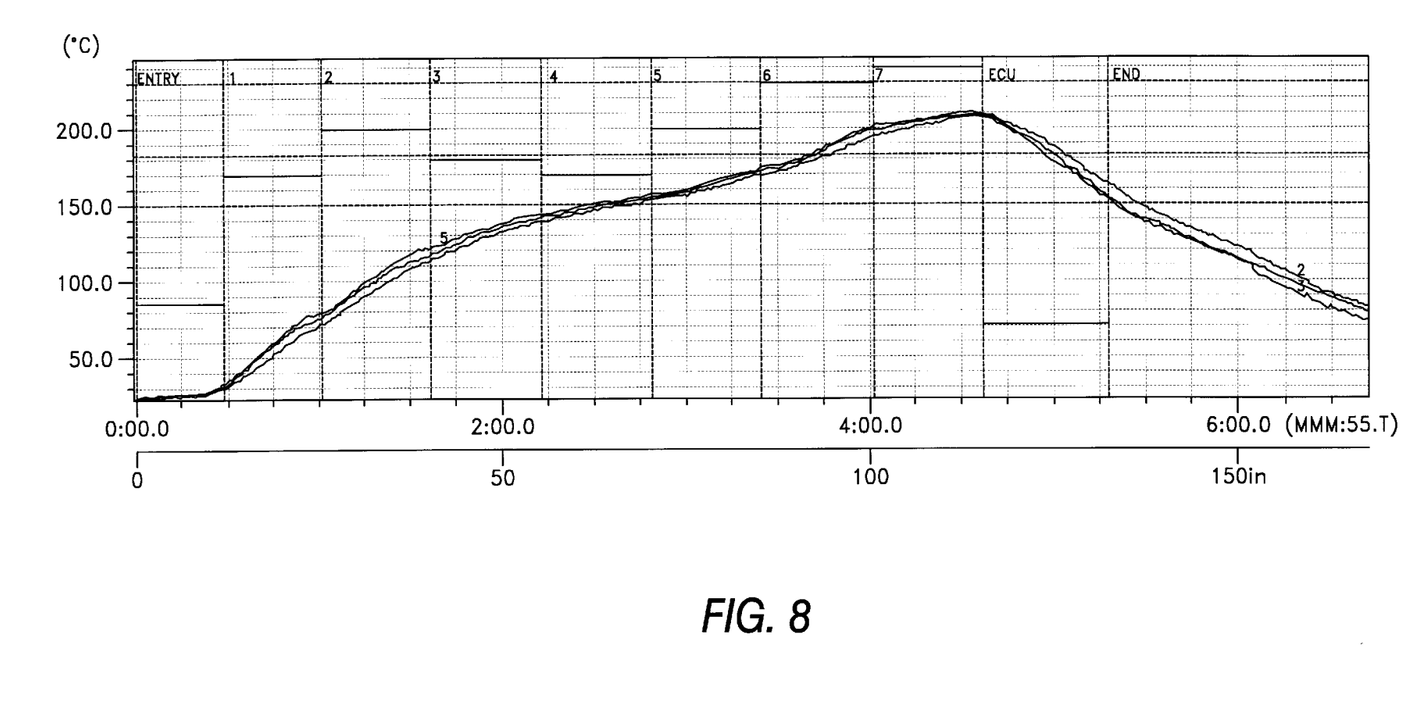
FIG. 8 is a graphical representation of a typical reflow solder process time-temperature profile used in conjunction with the present invention.

FIG. 8 is a graphical representation of a typical reflow solder process time-temperature profile used in conjunction with the present invention. As shown in the Figure, varying temperatures are applied to the components being reflow soldered for varying intervals in order to effect controlled reflow of the solder elements or paste. A number of different considerations which are presently well understood in the art (including, without limitation, the composition of solder being used, the type of reflow processing equipment, and the types of IC devices being mounted) determine the specific time and temperature parameters of the profile used with a given application; it can therefore be appreciated that a large number of different profiles may be used successfully with the various embodiments of the present invention.

While the above detailed description has shown, described, and pointed out the fundamental novel features of the invention as applied to various embodiments, it will be understood that various omissions, substitutions, and changes in the form and details of the device and processes illustrated may be made by those skilled in the art without departing from the spirit of the invention.

What is claimed is:

1. A method of mounting an integrated circuit device having connecting leads to a circuit board, comprising the steps of:

locating solder material on a mounting substrate such that said solder material communicates with selected apertures in the mounting substrate corresponding to said connecting leads of the integrated circuit device;

positioning said integrated circuit device with respect to said mounting substrate and said circuit board such that said connecting leads of said integrated circuit communicate both the apertures in said mounting substrate and said solder material and are aligned with said circuit board, so as to form an assembly; and heating said assembly so as to melt the solder material to form an electrical contact between the integrated circuit leads and the circuit board.

2. The method of claim 1, wherein said solder material is a eutectic paste.

3. The method of claim 1, wherein said solder material is a solidified eutectic solder element being shaped to receive the connecting leads of the integrated circuit device, and said apertures are sized such that said solidified element will not pass through.

4. A method of mounting an integrated circuit device having connecting leads to a circuit board, comprising the steps of:

locating solder material on a mounting substrate such that said solder material communicates with selected apertures in the mounting substrate corresponding to the connecting leads of the integrated circuit device;

attaching said mounting substrate to the circuit board;

positioning the integrated circuit device on said mounting substrate such that the connecting leads of the integrated circuit communicate with the apertures in said mounting substrate and the solder material, thereby forming an assembly; and heating said assembly so as to melt the solder material to form an electrical contact between the integrated circuit device and the circuit board.

5. The method of claim 4, wherein said solder material is a eutectic paste.

6. The method of claim 4, wherein said solder material is a solidified eutectic solder element being shaped to receive the connect leads of the integrated circuit device, and said apertures are sized such that said solidified element will not pass through.

7. A method of mounting an integrated circuit device having connecting leads to a circuit board having terminals, comprising the steps of:

attaching a mounting substrate having apertures corresponding to the connecting leads of the integrated circuit device to the circuit board such that said apertures communicate with said terminals;

locating solder material on said mounting substrate such that said solder material communicates with said apertures in said mounting substrate;

positioning the integrated circuit device on said mounting substrate such that the connecting leads of the integrated circuit communicate with the apertures in said mounting substrate and the solder material, thereby forming an assembly; and heating said assembly so as to melt the solder material to form an electrical contact between the integrated circuit device and the circuit board.

* * * * *